(12) United States Patent
Matsudera et al.

(10) Patent No.: US 6,700,411 B2
(45) Date of Patent: Mar. 2, 2004

(54) MOS-TYPE SEMICONDUCTOR INTEGRATED CIRCUIT

(75) Inventors: Katsuki Matsudera, Yokohama (JP); Masaru Koyanagi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/234,106

(22) Filed: Sep. 5, 2002

(65) Prior Publication Data

US 2003/0001620 A1 Jan. 2, 2003

Related U.S. Application Data

(62) Division of application No. 09/520,632, filed on Mar. 7, 2000, now Pat. No. 6,480,034.

(30) Foreign Application Priority Data

Mar. 8, 1999 (JP) ............................................. 11-060081

(51) Int. Cl.[7] .............................................. H03K 19/094
(52) U.S. Cl. ...................... 326/113; 326/17; 326/112; 326/119
(58) Field of Search ...................... 326/17, 112, 119, 326/113, 121, 82, 83

(56) References Cited

U.S. PATENT DOCUMENTS 4,609,836 A * 9/1986 Koike .......................... 307/451
5,541,529 A    7/1996 Mashiko et al.

* cited by examiner

Primary Examiner—Michael Tokar
Assistant Examiner—Anh Q. Tran
(74) Attorney, Agent, or Firm—Finnegan, Henderson, Farabow, Garrett & Dunner, L.L.P.

(57) ABSTRACT

An MOS-type semiconductor integrated circuit has two MOS transistors of the opposite conductivity channel types connected in series between a high-voltage potential terminal and a ground potential terminal. Those two MOS transistors constitute an inverter and their gates are connected together to an input node. As output nodes, first and second nodes are provided with a current path in between which includes transistors whose gates are connected to the high-voltage potential terminal. A current path including the first transistor which constitutes a switch is inserted between the first node and the output node, and a current path including the second transistor and a barrier transistor is inserted between the second node and the output node. The gates of the first and second transistors are respectively connected with complementary clock signals. The bate of the barrier transistor is connected to the high-voltage potential terminal.

1 Claim, 6 Drawing Sheets

MOS-TYPE SEMICONDUCTOR INTEGRATED CIRCUIT

This is a division of application Ser. No. 09/520,632, now U.S. Pat. No. 6,480,034, filed Mar. 7, 2000, which is incorporated herein by reference.

BACKGROUND OF THE INVENTION

The present invention relates to an MOS-type semiconductor integrated circuit including a CMOS transistor circuit which is adapted to an interface between circuit areas of different supply voltages.

In general, a circuit at the preceding stage of an MOS transistor switch circuit, which is constructed into a circuit interface, comprises a logic circuit such as an inverter, an NAND circuit or an NOR circuit.

Figure 1:
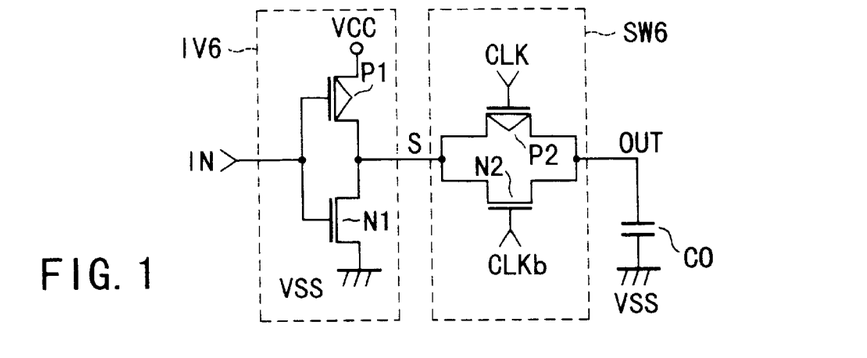
FIG. 1 is a circuit diagram showing a combination of an inverter and an MOS transistor switch according to a prior art.

FIG. 1 is a circuit diagram showing a combination of an inverter IV6 and an MOS transistor switch SW6 according to prior art. This circuit comprises a total of four elements, namely, two P-channel MOS transistors P1 and P2 and two N-channel MOS transistors N1 and N2.

The inverter IV6 has the transistors P1 and N1 connected in series between a supply voltage VCC and a ground potential VSS, with the gates of both transistors being connected together to an input node IN. The drains of both transistors are connected together to an output node S.

The MOS transistor switch SW6 has the transistors P2 and N2 connected with their current paths in parallel to each other. The gates of both transistors P2 and N2 are respectively supplied with complementary clock signals CLK and CLKb in which when one of which becomes a high level "H", the other one has a low level "L". One end of the node of the parallel connection is connected to the output node S and the other end of the parallel connection is connected to an output node OUT for driving a capacitive load C0.

In this circuit, therefore, when the clock signal CLK is at "L" (low level) and the clock signal CLKb is at "H" (high level), the nodes S and OUT are electrically connected together, so that the input level from the previous stage is output as it is. When the clock signal CLK is at "H" and the clock signal CLKb is at "L", the nodes S and OUT are electrically disconnected from each other, so that there is a high impedance state between both nodes.

In such an ordinary combination of an inverter and an MOS transistor switch, when the MOS transistor switch is at a high impedance state, the supply voltage VCC is applied between the source and drain of each transistor N2 or P2 depending on the input from the preceding stage or the voltage status on the output side.

If the input to the input node IN has the "H" level (VCC level) and the input clock signal CLK/CLKb is "L"/"H" in the initial state, for example, the output node S becomes "L" so that an output of the "L" level is output from the output node OUT. At this time, the voltage of VCC is applied between the source and drain of the transistor P1. When the level of the input to the input node IN changes to "L" from "H" after the level of the clock signal CLK/CLKb changes to "H"/"L " from "L"/"H", the voltage of VCC is applied between the source and drain of each of the transistors N1, N2 and P2.

As the miniaturization of transistors that are incorporated into a semiconductor device progresses, the number of circuit portions which are driven by the internally dropped voltage as the supply voltage increases. In this respect, more attempts are being made to design transistors on the premise of the use of the internally dropped voltage. Such a design process often guarantees the reliability of transistors only in the range of the internally dropped voltage.

That is, an ordinary circuit structure will be applied with too high voltage to the transistors in the circuit area that generates an internally dropped voltage from an external supply voltage, the external interface and the portion which cannot use the dropped voltage as its supply voltage from the viewpoint of the circuit structure, which may deteriorate the transistors. Some kind of voltage buffer means is therefore essential to deal with this problem.

Even in the circuit combination of the inverter and MOS transistor switch as shown in FIG. 1, therefore, the external supply voltage may be applied directly between the source and drain of each transistor in some cases. To make the circuit operable on the external supply voltage therefore demands some kind of countermeasures.

Generally speaking, an MOS transistor is deteriorated when the transistor is turned on with the supply voltage applied between its source and drain, thus causing the current to flow through the transistor. This case is equivalent to the switching of the transistor to the ON state from the OFF state.

As apparent from the above, the miniaturization of transistors increases the number of circuit portions which use the internally dropped voltage as the supply voltage and guarantees the reliability of transistors only in the range of the internally dropped voltage. Such a transistor circuit inevitably includes the circuit area that generates an internally dropped voltage from an external supply voltage, the external interface and a portion which cannot uses the dropped voltage as its supply voltage from the viewpoint of the circuit structure.

It is therefore necessary to add a circuit serving as voltage buffer means in such circuit portions. The addition of such a voltage buffer circuit inevitably results in an increase in the pattern area and a reduction in signal transmission speed. Some attempts should therefore be made to suppress this inconvenience.

BRIEF SUMMARY OF THE INVENTION

Accordingly, it is an object of the present invention to provide an MOS-type semiconductor integrated circuit which decreases the maximum voltage to be applied between the source and drain of each MOS transistor while minimizing an increase in the number of elements in an MOS transistor switch circuit and a reduction in signal transmission speed.

To achieve the above object, according to one aspect of this invention, there is provided an MOS-type semiconductor integrated circuit comprising a switch circuit including a logic circuit operable on a voltage between a predetermined high-potential supply voltage and a low-potential supply voltage and a first MOS transistor of a first conductivity type and a second MOS transistor of a second conductivity for controlling transfer of an output of the logic circuit with complementary signals; an output node of the logic circuit being separated into a first node to be connected to a path including the first MOS transistor and a second node to be connected to a path including the second MOS transistor; and a current path comprising one or more MOS transistors and inserted between the first node and the second node, and a current path comprising an MOS transistor of the same conductivity as that of at least one of the path including the first MOS transistor and the path including the second MOS transistor and provided between the at least one of the path including the first MOS transistor and the path including the second MOS transistor and an output node of the switch circuit.

According to this invention, a current path including a minimum number of MOS transistors is provided where needed with respect to a transistor whose breakdown voltage is lower than the high-potential supply voltage, thereby making the voltage applied to that transistor lower than the high-potential supply voltage.

DETAILED DESCRIPTION OF THE INVENTION

Figure 2:
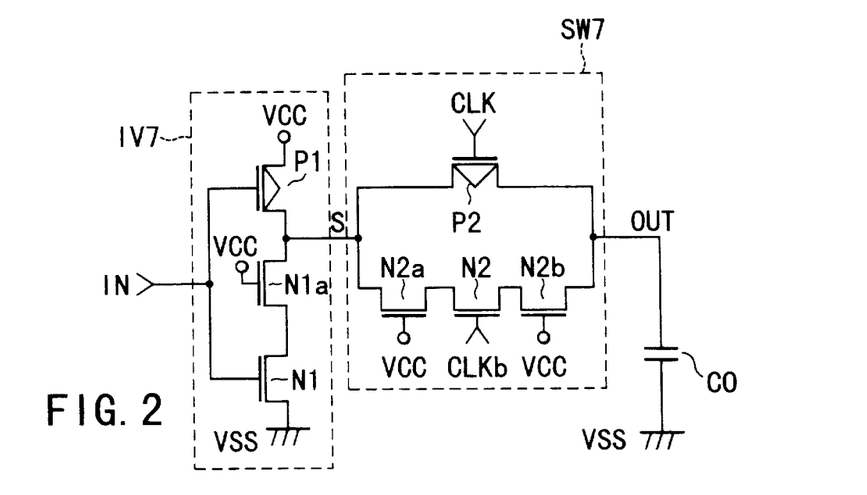
FIG. 2 is a circuit diagram illustrating the circuit structure of a combination of an inverter and an MOS transistor switch according to a first embodiment of this invention.

FIG. 2 illustrates the circuit structure of a first embodiment which overcomes the problem of the prior art by reducing a voltage applied between the source and drain of an N channel MOS transistor when the breakdown voltage of only the N channel MOS transistor is lower than an external supply voltage VCC.

The circuit structure in FIG. 2 comprises an inverter IV7 and an MOS transistor switch SW7. The structure of the embodiment in FIG. 2 has, in addition to the conventional circuit in FIG. 1, an N channel MOS transistor N1$a$ whose current path is connected between the node S and the drain of the transistor N1 and whose gate is connected to the supply voltage VCC, an N channel MOS transistor N2$a$ whose current path is connected between the node S and one end of the transistor N2 and whose gate is connected to the supply voltage VCC, and an N channel MOS transistor N2$b$ whose current path is connected between the other end of the transistor N1 and the output node OUT and whose gate is connected to the supply voltage VCC. Because the other structure is the same as that shown in FIG. 1, like or same reference numerals are given to those components which are the same as the corresponding components of the prior art.

With this structure, the N channel MOS transistors N1$a$, N2$a$ and N2$b$ are always ON, the voltage applied between the source and drain of each of the transistors N1 and N2 drops by a threshold voltage Vth of those N channel MOS transistors N1$a$, N2$a$ and N2$b$ and is suppressed to VCC-Vth at a maximum.

When an input of an "H" level is supplied to the input node IN of the inverter IV7, for example, the transistor P1 is turned off and the transistor N1 is turned on, causing the potential at the node S to have an "L" level which is higher than VSS by Vth. When the potential of the output node OUT becomes VCC and the clock signal CLK has an "L" level and the clock signal CLKb has an "H" level then, the switch circuit SW7 becomes enabled. As two MOS transistors N2$a$ and N2$b$ are connected in series between the output node OUT and the node S, a voltage of VCC-3Vth is eventually applied between the source and drain of the transistor 2.

When an input of an "L" level is supplied to the inverter IV7, on the other hand, the transistor P1 is turned on and the transistor N1 is turned off, causing the voltage VSS-to be applied to the node S and allowing an "H" level lower than VSS by Vth to be applied to the transistor N1.

Because the circuit in FIG. 2 requires seven elements (two P channel MOS transistors and five N channel MOS transistors) to accomplish the same function as that of the 4-element circuit in FIG. 1, the pattern area is undesirably increased while the breakdown voltage of the transistors has been improved.

Further, this circuit structure has five N channel MOS transistors connected in series from the output node OUT to the ground potential VSS, thus considerably reducing the speed of pulling the voltage at the output node OUT to the ground potential VSS.

Embodiments which will be discussed below have been contrived to improve those shortcomings.

Figure 3:
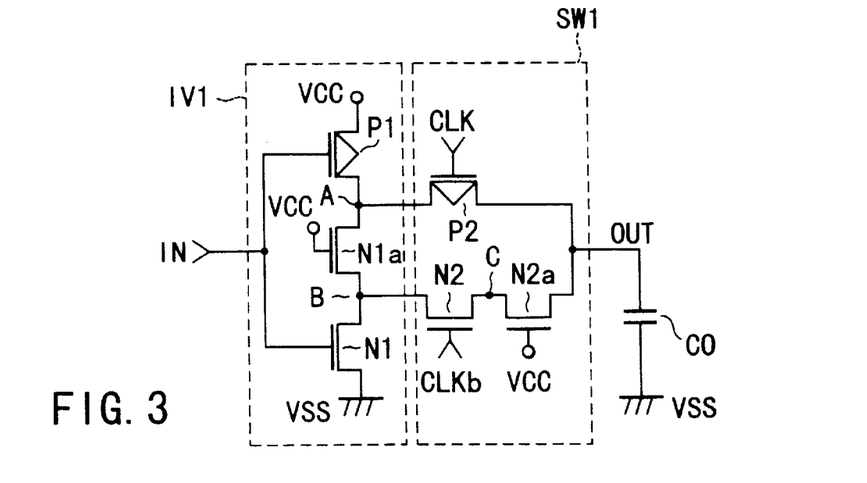
FIG. 3 is a circuit diagram illustrating the structure of a combination of an inverter and an MOS transistor switch according to a second embodiment of this invention.

FIG. 3 is a circuit diagram illustrating the structure of a combination of an inverter IV1 and an MOS transistor switch SW1 according to the second embodiment of this invention. This embodiment covers a circuit structure in the case where only the breakdown voltage of N channel MOS transistors is lower than the supply voltage VCC. The circuit comprises two P channel MOS transistors P1 and P2 and four N channel MOS transistors N1, N2, N1$a$ and N2$a$.

Referring to FIG. 3, an inverter IV1 is constructed as follows. The transistors P1, N1$a$ and N1 are connected in series between the supply voltage VCC and the ground potential VSS. The gates of the transistors P1 and N1 are connected together to an input node IN.

The output node of the inverter is separated into two nodes with a current path in between which includes the transistor N1a whose gate is connected to the supply voltage VCC. Specifically, the connection node between one end of the current path of the transistor N1a and the transistor P1 serves as an output node A and the connection node between the other end of the current path of the transistor N1a and the transistor N1 serves as an output node B.

The MOS transistor switch SW1 is constructed as follows. The current path of the transistor P2 is inserted between the output node A of the inverter and the output node OUT of the switch SW1. The current paths of the transistors N2 and N2a are inserted in series between the output node B of the inverter and the output node OUT of the switch SW1. Complementary clock signals CLK and CLKb are respectively supplied to the gates of the transistors P2 and N2. The gate of the transistor N2a is connected to the supply voltage VCC. The output node OUT serves as a terminal portion for supplying a signal for driving a capacitive load C0.

When the clock signal CLK is at "L" (low level) and the clock signal CLKb is at "H" (high level), the output node A is electrically connected to the output node OUT and the output node B is electrically connected to the output node OUT, the above circuit outputs the input level from the preceding stage as it is. When the clock signal CLK is at "H" and the clock signal CLKb is at "L", the output node A is electrically disconnected from the output node OUT and the output node B is electrically disconnected from the output node OUT, the circuit becomes a high impedance state.

In this embodiment, the transistor N1a serves as a barrier transistor which is inserted in such a way that the supply voltage VCC is not applied between the source and drain of each of the transistors N1 and N2 (i.e., between the nodes A and B and between the nodes B and C). The transistor N2a likewise serves as a barrier transistor which is inserted in such a way that the supply voltage VCC is not applied between the source and drain of the transistor N2 (between the nodes B and C).

A description will now be given of the general operation of the second embodiment and the effect of the barrier transistors. In the following description, "L" is the low level (VSS: low-potential supply voltage) and "H" is the high level (VCC: high-potential supply voltage).

(i) Let us consider the state in which the input node IN is at "L", the clock signal CLK/CLKb is at "H"/"L" and the output node OUT is at "L".

The two transistors P1 and N2a are ON and the other transistors are OFF. At this time, the voltage at the node A is VCC, the voltage at the node B is VCC-Vth and the voltage at the node C is VSS where Vth is the threshold voltage of N channel MOS transistors in the circuit. Because the transistor N1a serves as a barrier transistor under this state, only the voltage of VCC-Vth is applied between the source and drain of each of the transistors N1 and N2 (in OFF state).

(ii) Let us consider the state in which the input node IN is at "L", the clock signal CLK/CLKb is at "L"/"H" and the output node OUT is at "H".

All the transistors except the transistor N1 are ON. At this time, the voltage at the node A is VCC, the voltages at the nodes B and C are VCC-Vth. As the transistor N1a serves as a barrier transistor in this state too, only the voltage of VCC-Vth is applied between the source and drain of the transistor N1 (in OFF state).

(iii) Let us consider the state in which the input node IN is at "H", the clock signal CLK/CLKb is at "H"/"L" and the output node OUT is at "H".

The transistors N1 and N1a are ON and the other transistors are OFF. At this time, the voltages at the nodes A and B are VSS and the voltage at the node C is VCC-Vth. Because the transistor N2a serves as a barrier transistor in this state, only the voltage of VCC-Vth is applied between the source and drain of the transistor N2 (in OFF state).

In view of the above, in a case of the circuit combination of a logic circuit (an inverter in this example) and an MOS transistor switch as shown in FIG. 3, the maximum voltage that is applied between the source and drain of each of the N channel MOS transistors N1 and N2 can be suppressed to VCC-Vth. What is more, it is possible to minimize an increase in the circuit area which results from the addition of the minimum number of elements and minimize a reduction in charging/discharging speed.

Figure 4:
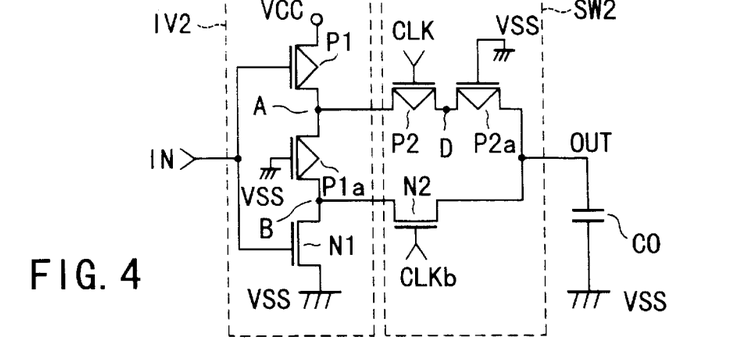
FIG. 4 is a circuit diagram showing the structure of a combination of an inverter and an MOS transistor switch according to a third embodiment of this invention.

FIG. 4 is a circuit diagram illustrating the structure of a combination of an inverter and an MOS transistor switch according to the third embodiment of this invention. This embodiment covers a circuit structure in the case where only the breakdown voltage of P channel MOS transistors is lower than the supply voltage VCC. The circuit comprises four channel MOS transistors P1, P2, P1a and P2a and two N channel MOS transistors N1 and N2.

Referring to FIG. 4, an inverter IV2 is constructed as follows. The transistors P1, P1a and N1 are connected in series between the supply voltage VCC and the ground potential VSS. The gates of the transistors P1 and N1 are connected together to an input node IN.

The output node of the inverter is separated into two nodes with a current path in between which includes the transistor P1a whose gate is connected to the ground potential VSS. Specifically, the connection node between one end of the current path of the transistor P1a and the transistor P1 serves as an output node A and the connection node between the other end of the current path of the transistor P1a and the transistor N1 serves as an output node B.

An MOS transistor switch SW2 is constructed as follows. The current paths of the transistors P2 and P2a are inserted in series between the output node A of the inverter and the output node OUT of the switch SW2. The current path of the transistor N2 is inserted between the output node B of the inverter and the output node OUT of the switch SW2. Complementary clock signals CLK and CLKb are respectively supplied to the gates of the transistors P2 and N2. The gate of the transistor P2a is connected to the ground potential VSS. The output node OUT serves as a terminal portion for supplying a signal for driving a capacitive load C0.

When the clock signal CLK is at "L" (low level) and the clock signal CLKb is at "H" (high level), the output node A is electrically connected to the output node OUT and the output node B is electrically connected to the output node OUT, the above circuit outputs the input level from the preceding stage as it is. When the clock signal CLK is at "H" and the clock signal CLKb is at "L", the output node A is electrically disconnected from the output node OUT and the output node B is electrically disconnected from the output node OUT, the circuit becomes a high impedance state.

In this embodiment, the transistor P1a serves as a barrier transistor which is inserted in such a way that the supply voltage VCC is not applied between the source and drain of each of the transistors P1 and P2 (i.e., between the nodes A and B and between the nodes A and D). The transistor P2*a* likewise serves as a barrier transistor which is inserted in such a way that the supply voltage VCC is not applied between the source and drain of the transistor P2 (between the nodes A and D).

The following will discuss the general operation of the third embodiment and the effect of the barrier transistors. In the following description, "L" is the low level (VSS: low-potential supply voltage) and "H" is the high level (VCC: high-potential supply voltage).

(i) Let us consider the state in which the input node IN is at "L", the clock signal CLK/CLKb is at "H"/"L" and the output node OUT is at "L".

The two transistors P1 and P1*a* are ON and the other transistors are OFF. At this time, the voltage at the node A is VCC, the voltage at the node B is VCC and the voltage at the node D is Vth which is the threshold voltage of P channel MOS transistors in the circuit. As the transistor P2*a* serves as a barrier transistor in this state, only the voltage of VCC-Vth is applied between the source and drain of the transistor P2 (in OFF state).

(ii) Let us consider the state in which the input node IN is at "H", the clock signal CLK/CLKb is at "H"/"L" and the output node OUT is at "H".

The transistors N1 and P2*a* are ON and the other transistors are OFF. At this time, the voltage at the node B is VSS and the voltages at the nodes A and D are Vth. As the transistors P1*a* and P2*a* serve as barrier transistors in this state, only the voltage of VCC-Vth is applied between the source and drain of each of the transistors P1 and P2 (in OFF state).

In view of the above, in a case of the circuit combination of a logic circuit (an inverter in this example) and an MOS transistor switch as shown in FIG. 4, the maximum voltage that is applied between the source and drain of each of the P channel MOS transistors P1 and P2 can be suppressed to VCC-Vth. It is also possible to minimize an increase in the circuit area which results from the addition of elements and minimize a reduction in charging/discharging speed or signal transfer speed.

Figure 5:
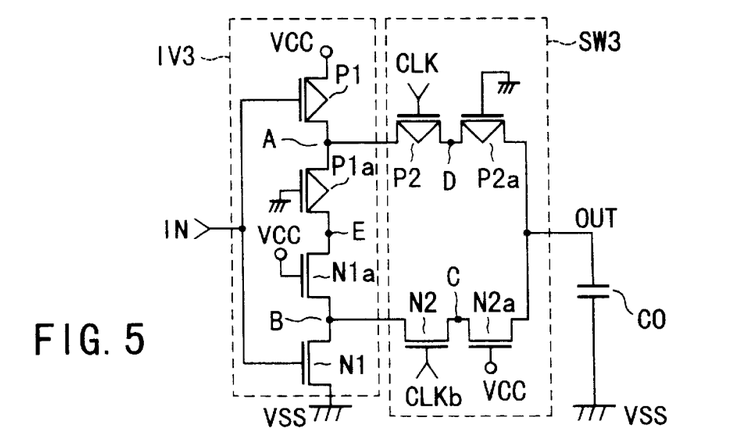
FIG. 5 is a circuit diagram showing the structure of a combination of an inverter and an MOS transistor switch according to a fourth embodiment of this invention.

FIG. 5 is a circuit diagram illustrating the structure of a combination of an inverter and an MOS transistor switch according to the fourth embodiment of this invention. This embodiment covers a circuit structure in the case where the breakdown voltages of both P channel and N channel MOS transistors are lower than the supply voltage VCC. The circuit comprises four P channel MOS transistors P1, P2, P1*a* and P2*a* and four N channel MOS transistors N1, N2, N1*a* and N2*a*.

In FIG. 5, an inverter IV3 is constructed as follows. The transistors P1, P1*a*, N1*a* and N1 are connected in series between the supply voltage VCC and the ground potential VSS. The gates of the transistors P1 and N1 are connected together to an input node IN.

The output node of the inverter is separated into two nodes with a current path in between which includes a series circuit of the transistor P1*a* whose gate is connected to the ground potential VSS and the transistor N1*a* whose gate is connected to the supply voltage VCC. Specifically, the connection node between one end of the series circuit (the end portion of the current path of the transistor P1*a*) and the transistor P1 serves as an output node A and the connection node between the other end of the series circuit (the end portion of the current path of the transistor N1*a*) and the transistor N1 serves as an output node B.

An MOS transistor switch SW3 is constructed as follows. The current paths of the transistors P2 and P2*a* are inserted in series between the output node A of the inverter and the output node OUT of the switch SW3. The current paths of the transistors N2 and N2*a* are inserted in series between the output node B of the inverter and the output node OUT of the switch SW3. Complementary clock signals CLK and CLKb are respectively supplied to the gates of the transistors P2 and N2. The gate of the transistor P2*a* is connected to the ground potential VSS and the gate of the transistor N2*a* is connected to the supply voltage VCC. The output node OUT serves as a terminal portion for supplying a signal for driving a capacitive load C0.

When the clock signal CLK is at "L" (low level) and the clock signal CLKb is at "H" (high level), the output node A is electrically connected to the output node OUT and the output node B is electrically connected to the output node OUT, the above circuit outputs the input level from the preceding stage as it is. When the clock signal CLK is at "H" and the clock signal CLKb is at "L", the output node A is electrically disconnected from the output node OUT and the output node B is electrically disconnected from the output node OUT, the circuit becomes a high impedance state.

The fourth embodiment has the structure that has the barrier transistors of both the second and third embodiments (N1*a*, N2*a*, P1*a* and P2*a*). When the input node IN is at "L", the voltage at the output node OUT is VSS and the clock signal CLK/CLKb is at "H"/"L", the voltages at the nodes A and E are VCC, the voltage at the node B is VCC-Vth, the voltage at the node C is VSS and the voltage at the node D is Vth. When the input node IN is at "H", the voltage at the output node OUT is VCC and the clock signal CLK/CLKb is at "H"/"L", the voltage at the node A is Vth, the voltage at the node B is VSS, the voltage at the node C is VCC-Vth, the voltage at the node D is VCC, and the voltage at the node E is VSS.

As a result, the voltage between the source and drain of each of the P channel MOS transistors (P1 or P2) and the N channel MOS transistor (N1 or N2) is restricted to VCC-Vth.

The foregoing description of each embodiment has been given with reference to the case where an inverter is located at the preceding stage of each of the MOS transistor switches SW7, SW1, SW2 and SW3. However, any of the second to fourth embodiments may be adapted to other logic circuits, such as a NOR gate circuit and a NAND gate circuit, with the same capability of restricting the voltage between the source and drain of each of the P channel MOS transistor and N channel MOS transistor which serve as switching elements in the circuit.

Figure 6:
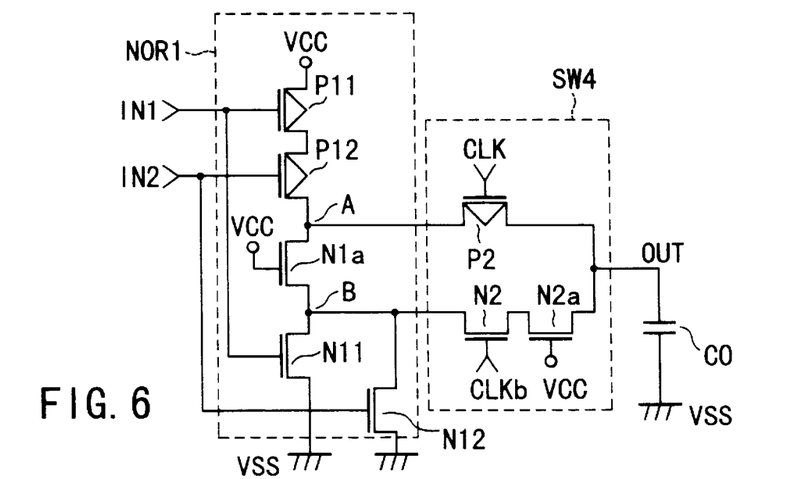
FIG. 6 is a circuit diagram showing the structure of a combination of a NOR gate and an MOS transistor switch according to a fifth embodiment of this invention.

FIG. 6 is a circuit diagram illustrating the structure of a combination of a NOR gate and an MOS transistor switch according to the fifth embodiment of this invention. This embodiment covers a circuit structure in the case where only the breakdown voltage of N channel MOS transistors is lower than the supply voltage VCC. The circuit comprises three P channel MOS transistors P11, P12 and P2 and five N channel MOS transistors N11, N12, N2, N1*a* and N2*a*.

In FIG. 6, a NOR gate NOR1 is constructed as follows. The transistors P11, P12, N1*a* and N11 are connected in series between the supply voltage VCC and the ground potential VSS. The gate of the transistor N12 is connected in parallel to the drain and source of the transistor N11. The gates of the transistors P11 and N11 are connected together to an input node IN1. The gates of the transistors P12 and N12 are connected together to an input node IN2.

The output node of the NOR gate is separated into two nodes with a current path in between which includes the transistor N1a whose gate is connected to the supply voltage VCC. Specifically, the connection node between one end of the current path of the transistor N1a and the transistor P12 serves as an output node A and the connection node between the other end of the current path of the transistor N1a and the transistor N11 serves as an output node B.

An MOS transistor switch SW4 is constructed in the same way as the switch SW1 in FIG. 3. The current path of the transistor P2 is inserted in between the output node A of the NOR gate and the output node OUT of the switch SW4. The current paths of the transistors N2 and N2a are inserted in series between the output node B of the NOR gate and the output node OUT of the switch SW4. Complementary clock signals CLK and CLKb are respectively supplied to the gates of the transistors P2 and N2. The gate of the transistor N2a is connected to the supply voltage VCC. The output node OUT serves as a terminal portion for supplying a signal for driving a capacitive load C0.

According to the fifth embodiment, like the second embodiment, the voltage between the source and drain of each of the N channel MOS transistors (N11, N12 and N2) can be suppressed to VCC-Vth.

Figure 7:
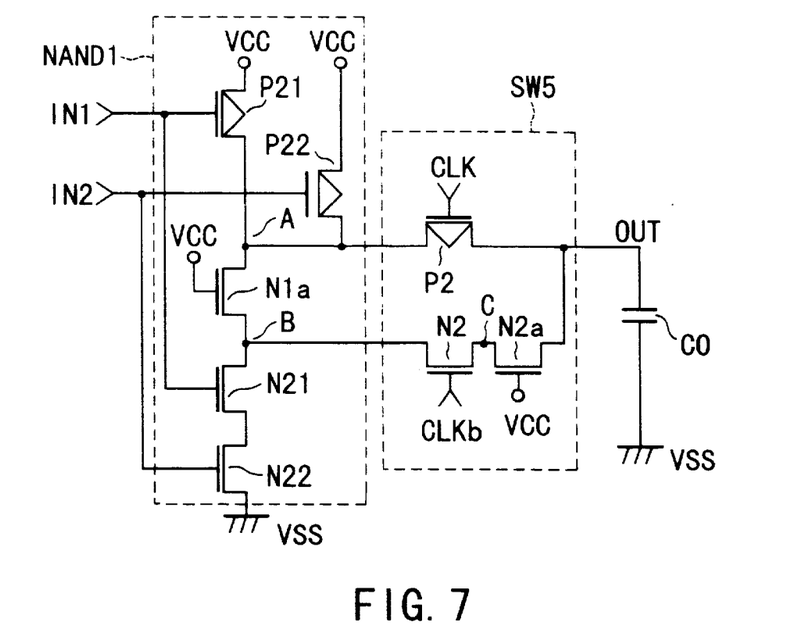
FIG. 7 is a circuit diagram depicting the structure of a combination of a NAND gate and an MOS transistor switch according to a sixth embodiment of this invention.

FIG. 7 is a circuit diagram illustrating the structure of a combination of a NAND gate and an MOS transistor switch according to the sixth embodiment of this invention. This embodiment also covers a circuit structure in the case where only the breakdown voltage of N channel MOS transistors is lower than the supply voltage VCC. The circuit comprises three P channel MOS transistors P21, P22 and P2 and five N channel MOS transistors N21, N22, N2, N1a and N2a.

Referring to FIG. 7, a NAND gate NAND1 is constructed as follows. The transistors P21, N1a, N21 and N22 are connected in series between the supply voltage VCC and the ground potential VSS. The gate of the transistor P22 is connected in parallel to the source and drain of the transistor P21. The gates of the transistors P21 and N21 are connected together to an input node IN1. The gates of the transistors P22 and N22 are connected together to an input node IN2.

The output node of the NAND gate is separated into two nodes with a current-path in between which includes the transistor N1a whose gate is connected to the supply voltage VCC. Specifically, the connection node between one end of the current path of the transistor N1a and the transistor P21 serves as an output node A and the connection node between the other end of the current path of the transistor N1a and the transistor N21 serves as an output node B.

An MOS transistor switch SW5 is constructed in the same way as the switch SW1 in FIG. 3. The current path of the transistor P2 is inserted in between the output node A of the NAND gate and the output node OUT of the switch SW5. The current paths of the transistors N2 and N2a are inserted in series between the output node B of the NAND gate and the output node OUT of the switch SW5. Complementary clock signals CLK and CLKb are respectively supplied to the gates of the transistors P2 and N2. The gate of the transistor N2a is connected to the supply voltage VCC. The output node OUT serves as a terminal portion for supplying a signal for driving a capacitive load C0.

According to the sixth embodiment, like the second embodiment, the voltage between the source and drain of each of the N channel MOS transistors (N21, N22 and N2) can be suppressed to VCC-Vth.

Figure 8:
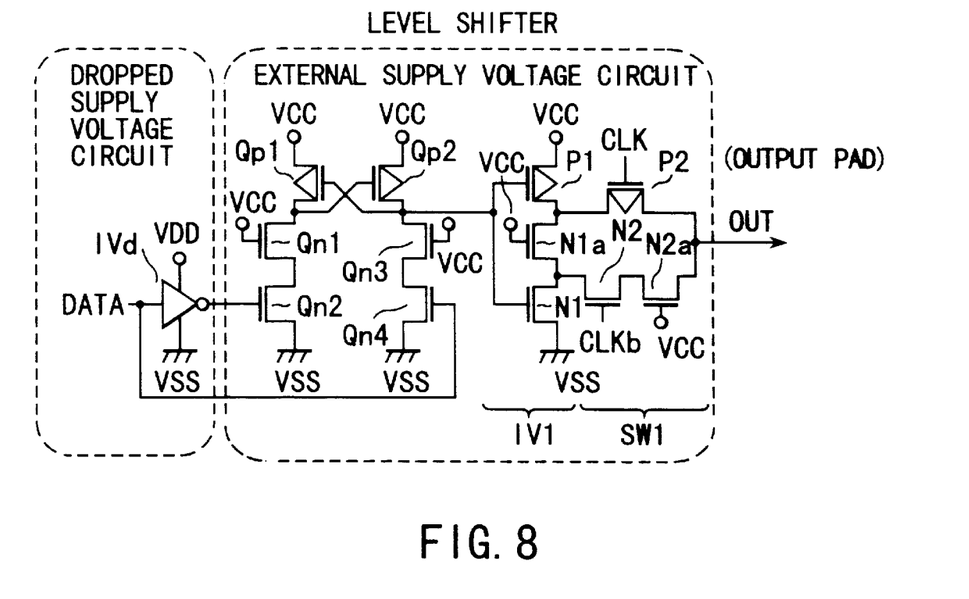
FIG. 8 is a circuit diagram depicting an application example to which the circuit of the second embodiment of this invention is adapted.

FIG. 8 is a circuit diagram depicting an application example in which the circuit of the second embodiment of this invention shown in FIG. 3 is adapted to an LSI. The inner sections of the circuit operate on a dropped supply voltage VDD (e.g., 2.5V) which is generated by dropping an external supply voltage VCC (e.g., 3.3V). Naturally, the circuit guarantee is designed based on this voltage VDD. A signal denoted as DATA is supplied to a level shifter via a circuit which operates on the dropped supply voltage VDD (an inverter IVd is typified in the diagram).

The level shifter has P channel MOS transistors Qp1 and Qp2 whose sources are supplied with the external supply voltage VCC and whose drains are connected to the sources of the transistors Qp2 and Qp1, N channel MOS transistors Qp1 and Qn2 connected in series between the drain of the transistor Qp1 and the ground potential VSS, and N channel MOS transistors Qn3 and Qn4 connected in series between the drain of the transistor Qp2. The supply voltage VCC is applied to the gates of the transistors Qp1 and Qn3, and an inverted signal of the signal DATA, obtained through the inverter IVd, and the signal DATA itself are respectively supplied to the gates of the transistors Qn2 and Qn4.

A signal which is in phase with the signal DATA coming through the inverter IVd of the dropped supply voltage circuit and has been level-shifted to the external ground potential VSS is supplied to the input node IN of the circuit in FIG. 3 from the drain of the transistor Qp2. As a result, in synchronism with the clock signal CLK/CLKb, a signal having the level of the external supply voltage and according to the signal DATA is acquired from the output node OUT that is connected to, for example, the output pad.

Generally speaking, the transistor at the last stage for an external output has a larger layout area than the other inner transistors, so that the use of the structure of this invention can reduce the layout area. Further, the use of the structure of this invention shortens the transfer delay from the leading edge of the clock signal CLK to the output.

The foregoing description of each embodiment has been given with reference to the case where a logic circuit located at the preceding stage and a switch circuit at the succeeding stage each comprise a combination of P channel MOS transistors and N channel MOS transistors. However, this invention may also be adapted to a structure in which each of the logic circuit located at the preceding stage and the switch circuit at the succeeding stage comprises, for example, only N channel MOS transistors.

Different embodiments will now be discussed with reference to FIGS. 9 through 16. To facilitate the understanding of those embodiments, like or same reference numerals are given to those components which are the same as the corresponding components of the embodiments that have already been explained.

Figure 9:
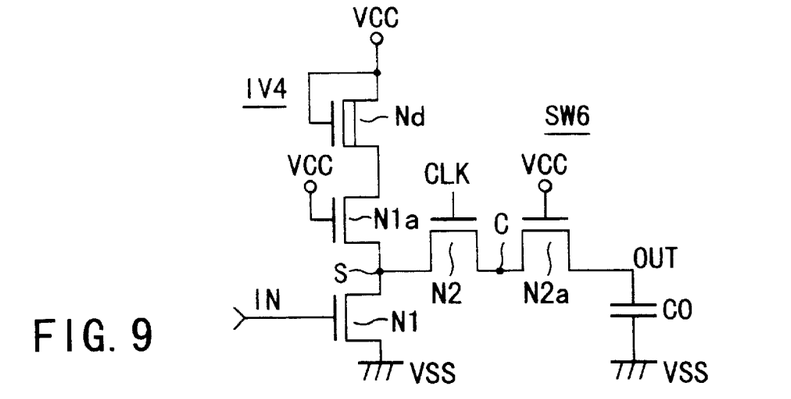
FIG. 9 is a circuit diagram illustrating the structure of a combination of an inverter and an MOS transistor switch according to a seventh embodiment of this invention.

In the embodiment in FIG. 9, an inverter IV4 comprises a depletion type N channel MOS transistor Nd and N channel MOS transistors N1a and N1 (identical to those of the previously discussed embodiments) connected in series between the supply voltage VCC and the ground potential VSS. The depletion type N channel MOS transistor Nd has its source and gate connected together. The supply voltage VCC is supplied to the gate of the transistor N1a which is a barrier transistor, and input data is supplied to the transistor N1.

An MOS transistor switch circuit SW6 comprises series-connected MOS transistors N2 and N2a connected between the connection node S between the transistors N1a and N1 and the output node OUT. The clock signal CLK is supplied to the gate of the transistor N2, and the supply voltage VCC is supplied to the gate of the barrier transistor N2a. A capacitive load C0 is connected between the output node OUT and the ground potential VSS.

In this embodiment, when the level of the input data to the input node IN becomes "L", the "H"-level output from the output node S of the inverter IV4 becomes VCC-Vth so that the source-drain voltage of the transistor N1 falls by Vth.

With the potential at the node S being VCC, even when the conductive state of the transistor N2 of the switch circuit SW6 is changed to the ON state from the OFF state in response to the clock signal CLK, the voltage VCC is not applied to the transistor N2 because the potential at the connection node C between the transistors N2 and N2a is Vth.

Figure 10:
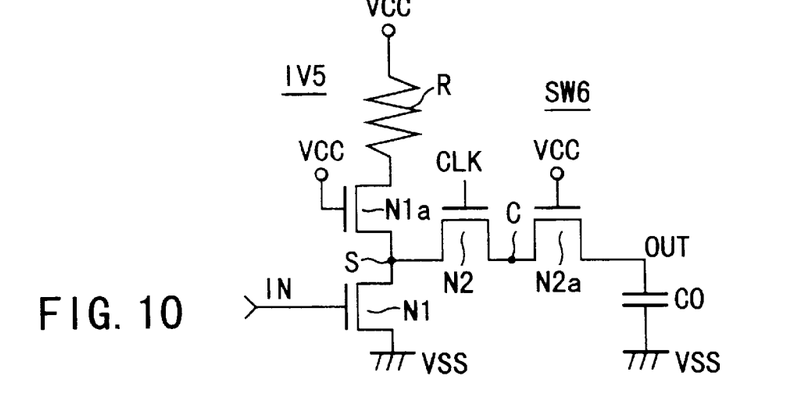
FIG. 10 is a circuit diagram illustrating the structure of a combination of an inverter and an MOS transistor switch according to an eighth embodiment of this invention.

In the embodiment in FIG. 10, an inverter IV5 is constructed by connecting a resistor R to the N channel MOS transistors N1a and N1 in place of the depletion type N channel MOS transistor Nd in the embodiment in FIG. 9. The other structure is the same as that of the circuit in FIG. 9. In this embodiment too, the voltage of VCC-Vth at a maximum is applied to the source and drain of each of the transistors N1 and N2.

Figure 11:
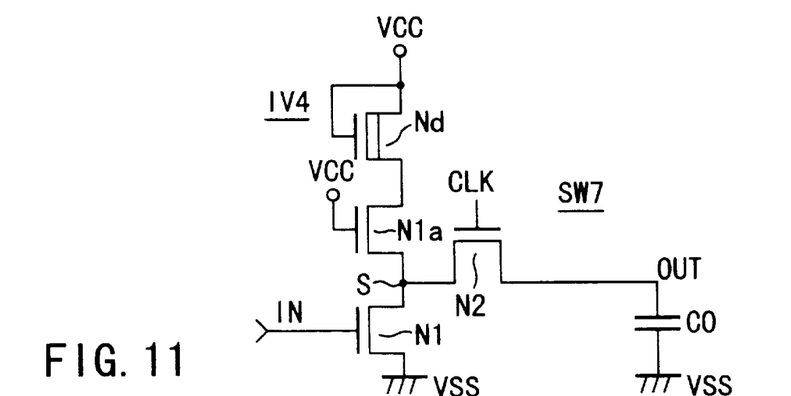
FIG. 11 is a circuit diagram illustrating the structure of a combination of an inverter and an MOS transistor switch according to a ninth embodiment of this invention.

The embodiment in FIG. 11 uses a switch circuit SW7 which is the switch circuit SW6 in the embodiment in FIG. 9 from which the barrier transistor N2a is omitted. In this embodiment in FIG. 11, the potential at the node S to which the transistors N1 and N2 are connected becomes VCC dropped by the threshold voltage Vth by the barrier transistor N1a, so that the supply voltage VCC will not be directly applied between the source and drain of each of the transistors N1 and N2 in whatever operational state of the circuit.

Figure 12:
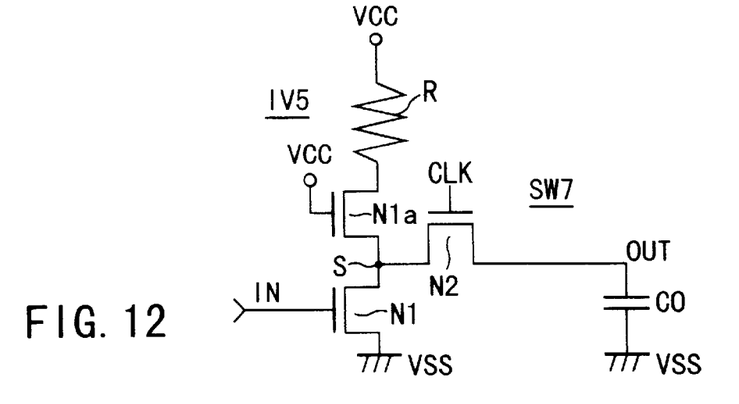
FIG. 12 is a circuit diagram illustrating the structure of a combination of an inverter and an MOS transistor switch according to a tenth embodiment of this invention.

The embodiment in FIG. 12 uses a switch circuit SW7 which is the switch circuit SW6 in the embodiment in FIG. 10 from which the barrier transistor N2a is omitted. In this embodiment in FIG. 12 too, the potential at the node S to which the transistors N1 and N2 are connected becomes VCC dropped by the threshold voltage Vth by the barrier transistor N1a, so that the supply voltage VCC will not be directly applied between the source and drain of each of the transistors N1 and N2 in whatever operational state of the circuit.

Figure 13:
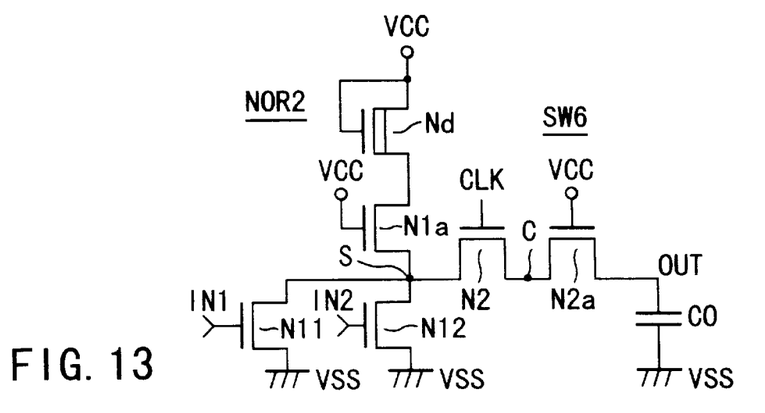
FIG. 13 is a circuit diagram showing the structure of a combination of a NOR gate and an MOS transistor switch according to an eleventh embodiment of this invention.

The embodiment in FIG. 13 is the embodiment in FIG. 9 whose inverter IV4 is replaced with a NOR gate NOR2. The embodiment in FIG. 13 differs from the embodiment in FIG. 9 only in that two transistors N11 and N12 instead of the transistor N1 connected between the node S and the ground node VSS are connected in parallel, and the other structure is the same as that of the circuit in FIG. 9. As in the previous two embodiments, therefore, the external supply voltage VCC will not be directly applied to the transistors N11, N12 and N2 in any operational state of the circuit that varies in accordance with the potentials at the logic input nodes IN1 and IN2 and the level of the clock signal CLK.

Figure 14:
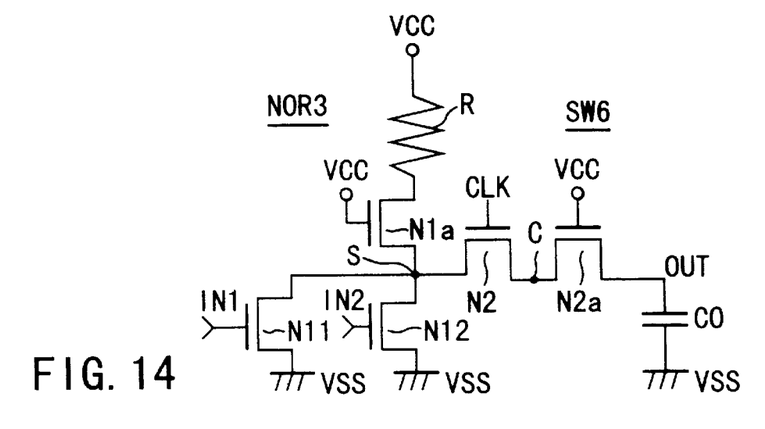
FIG. 14 is a circuit diagram showing the structure of a combination of a NOR gate and an MOS transistor switch according to a twelfth embodiment of this invention.

The embodiment in FIG. 14 is the embodiment in FIG. 13 whose depletion type N channel MOS transistor Nd is replaced with a resistor R to thereby construct a NOR gate NOR3. The other structure is the same as that of the embodiment in FIG. 13. In this embodiment, as in the previous embodiments, therefore, the external supply voltage VCC will not be directly applied to the transistors N11, N12 and N2 in any operational state of the circuit that varies in accordance with the potentials at the logic input nodes IN1 and IN2 and the level of the clock signal CLK.

Figure 15:
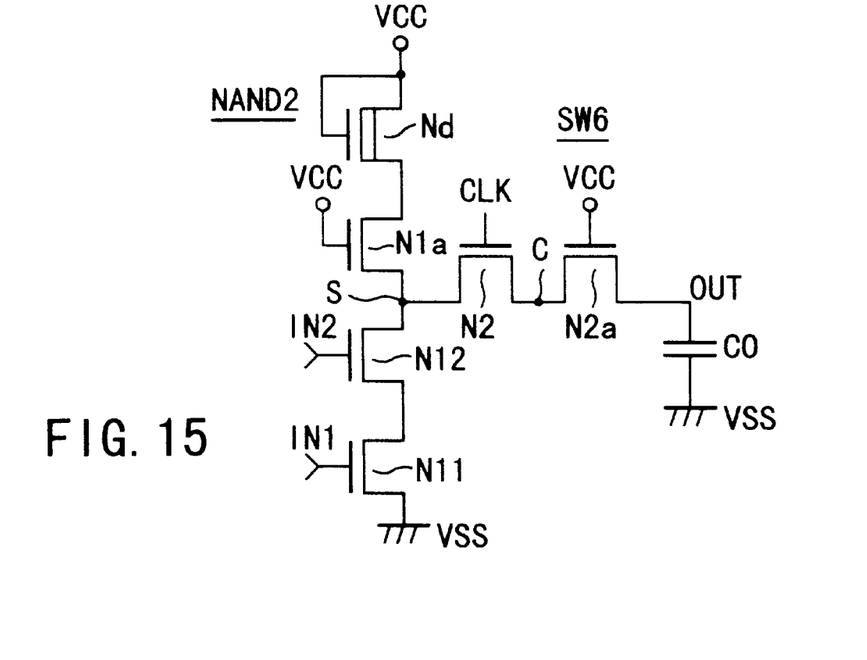
FIG. 15 is a circuit diagram depicting the structure of a combination of a NAND gate and an MOS transistor switch according to a thirteenth embodiment of this invention.

The embodiment in FIG. 15 is the embodiment in FIG. 9 whose inverter IV4 is replaced with a NAND gate NAND2. The embodiment in FIG. 15 differs from the embodiment in FIG. 9 only in that two transistors N11 and N12 instead of the transistor N1 connected between the node S and the ground node VSS are connected in series, and the other structure is the same as that of the circuit in FIG. 9. As in the previous embodiments, therefore, the external supply voltage VCC will not be directly applied to the transistors N11, N12 and N2 in any operational state of the circuit that varies in accordance with the potentials at the logic input nodes IN1 and IN2 and the level of the clock signal CLK.

Figure 16:
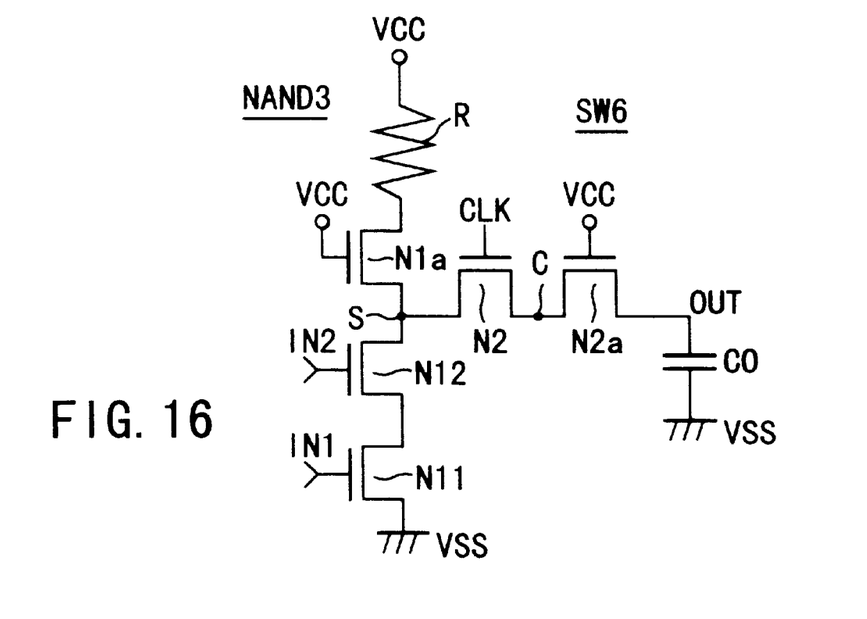
FIG. 16 is a circuit diagram depicting the structure of a combination of a NAND gate and an MOS transistor switch according to a fourteenth embodiment of this invention.

The embodiment in FIG. 16 is the embodiment in FIG. 15 whose depletion type N channel MOS transistor Nd is replaced with a resistor R to thereby construct a NAND gate NAND3. The other structure is the same as that of the embodiment in FIG. 15. In this embodiment, as in the previous embodiments, therefore, the external supply voltage VCC will not be directly applied to the transistors N11, N12 and N2 in any operational state of the circuit that varies in accordance with the potentials at the logic input nodes IN1 and IN2 and the level of the clock signal CLK.

According to the individual embodiments described above, the provision of barrier transistors at the minimum locations where necessary can restrict the maximum voltage to be applied between the source and drain of a transistor whose breakdown voltage is lower than the supply voltage VCC to VCC-Vth. A similar circuit structure using a barrier transistor can be taken for other logic circuits than an inverter, NOR gate and NAND gate each located at the preceding stage of an MOS transistor switch, such as a CMOS transistor logic circuit, an N channel MOS transistor inverter including a depletion type MOS transistor or an inverter which is constructed by a resistor and N channel MOS transistors.

In other words, the use of the above-described circuit structure can make the voltage to be applied between the source and drain of an MOS transistor smaller than the supply voltage to be supplied while minimizing an increase in the number of elements and a reduction in charging/discharging speed. Note that the gate level of the barrier transistor can take any value within the range where the reliability of a target transistor can be assured.

According to this invention, as specifically described above, barrier transistors are provided at the minimum locations where necessary, thereby providing an MOS-type semiconductor integrated circuit which can make the source-drain voltage of a switching transistor in the circuit smaller than the supply voltage while minimizing an increase in the number of elements and a reduction in charging/discharging speed.

What is claimed is:

1. An MOS-type semiconductor integrated circuit comprising:
    an input logic circuit including a first MOS transistor of a first conductivity channel type and a first MOS transistor of a second conductivity channel type connected in series between voltage supply terminals via a connection node, and a first barrier transistor connected between said connection node and one of said two first MOS transistors and set in a normally conductive state; and
    an output logic circuit including a second MOS transistor of said first conductivity channel type and a second MOS transistor of said second conductivity channel type connected in parallel between said connection node and an output node, and a second barrier transistor connected in series to one of said two second MOS transistors and set in a normally conductive state.

* * * * *